(12) United States Patent
Vaidyanathan

(10) Patent No.: US 9,796,108 B2
(45) Date of Patent: Oct. 24, 2017

(54) WEAR RESISTANT COATINGS FOR TOOL DIES

(75) Inventor: Krishna Kumar Vaidyanathan, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 12/996,849

(22) PCT Filed: Aug. 27, 2009

(86) PCT No.: PCT/US2009/004873
§ 371 (c)(1),
(2), (4) Date: Dec. 8, 2010

(87) PCT Pub. No.: WO2010/024902
PCT Pub. Date: Mar. 4, 2010

(65) Prior Publication Data
US 2011/0139958 A1   Jun. 16, 2011

Related U.S. Application Data

(60) Provisional application No. 61/092,424, filed on Aug. 28, 2008.

(51) Int. Cl.
*C23C 16/36* (2006.01)
*B28B 3/26* (2006.01)
(Continued)

(52) U.S. Cl.
CPC ............... *B28B 3/26* (2013.01); *B28B 3/269* (2013.01); *C23C 16/34* (2013.01); *C23C 16/36* (2013.01);
(Continued)

(58) Field of Classification Search
CPC ............ B28B 3/26; B28B 3/269; C23C 16/36
(Continued)

(56) References Cited

U.S. PATENT DOCUMENTS 3,656,995 A * 4/1972 Reedy, Jr. ............... 148/218
3,905,743 A * 9/1975 Bagley ................... 425/464
(Continued)

FOREIGN PATENT DOCUMENTS

DE  102006019866 A1 * 10/2007 ............ B28B 7/00
EP       1471165 A2 * 10/2004 ............ C23C 16/30
(Continued)

OTHER PUBLICATIONS

Surface roughness value conversions, Innovtive Organics. (date is not applicable).*
(Continued)

*Primary Examiner* — James Sanders
(74) *Attorney, Agent, or Firm* — Joseph M. Homa

(57) ABSTRACT

A tool die for forming a green ceramic body. The tool die has a wear resistant coating that is deposited on a substrate and has an outer or free surface having a morphology that provides a mean roughness in a range from about 0.03 μm up to about 0.8 μm Rq. In one embodiment, the wear resistant coating has multiple alternating layers of fine grained and coarse grained materials. Methods of making the tool die and wear resistant coating are also provided.

18 Claims, 6 Drawing Sheets

(51) Int. Cl.
*C23C 16/34* (2006.01)
*C23C 30/00* (2006.01)
*C23C 28/04* (2006.01)
*C23C 28/00* (2006.01)

(52) U.S. Cl.
CPC ............ *C23C 28/044* (2013.01); *C23C 28/42* (2013.01); *C23C 30/00* (2013.01); *Y10T 428/24355* (2015.01)

(58) Field of Classification Search
USPC ...... 249/114.1–116, 134–135; 427/133–135; 106/38.2
See application file for complete search history.

(56) References Cited

U.S. PATENT DOCUMENTS

| | | | |
|---|---|---|---|
| 3,964,937 A * | 6/1976 | Post et al. | 148/210 |
| 4,066,821 A * | 1/1978 | Cook et al. | 428/698 |
| 4,465,652 A * | 8/1984 | Lentz | 264/177.12 |
| 4,574,459 A * | 3/1986 | Peters | 29/527.4 |
| 4,686,156 A * | 8/1987 | Baldoni et al. | 428/698 |
| 4,721,518 A * | 1/1988 | Monji et al. | 65/374.11 |
| 4,747,864 A * | 5/1988 | Hagerty et al. | 65/102 |
| 4,837,231 A | 6/1989 | Endo et al. | |
| 4,990,372 A * | 2/1991 | Sunder et al. | 427/237 |
| 5,246,787 A * | 9/1993 | Schulz et al. | 428/629 |
| 5,256,449 A * | 10/1993 | Suzuki et al. | 427/248.1 |
| 5,552,102 A * | 9/1996 | Kragle et al. | 264/177.11 |
| 5,690,759 A * | 11/1997 | Wang | 249/114.1 |
| 5,766,782 A * | 6/1998 | Ljungberg | 428/698 |
| 5,851,680 A * | 12/1998 | Heau | C01B 21/0602 428/472 |
| 5,858,463 A * | 1/1999 | Ogura et al. | 427/255.21 |
| 6,015,614 A * | 1/2000 | Ruppi | 428/335 |
| 6,090,476 A * | 7/2000 | Thysell et al. | 428/216 |
| 6,093,479 A * | 7/2000 | Yoshimura et al. | 428/212 |
| 6,165,600 A * | 12/2000 | Ivkovich et al. | 428/213 |
| 6,193,497 B1 * | 2/2001 | Suzuki | 425/380 |
| 6,370,934 B1 * | 4/2002 | Maier | 72/467 |
| 6,756,111 B1 * | 6/2004 | Okada et al. | 428/216 |
| 6,902,764 B2 * | 6/2005 | Ljungberg et al. | 427/255.31 |
| 7,060,345 B2 * | 6/2006 | Fukui et al. | 428/216 |
| 7,192,637 B2 * | 3/2007 | Ruppu et al. | 428/216 |
| 7,587,919 B1 * | 9/2009 | Young | B21D 37/20 164/46 |
| 7,648,736 B2 * | 1/2010 | Ruppu et al. | 427/248.1 |
| 7,681,622 B2 * | 3/2010 | Sherman | 164/46 |
| 7,785,665 B2 * | 8/2010 | Gates et al. | 427/255.19 |
| 7,820,308 B2 * | 10/2010 | Park et al. | 428/697 |
| 7,858,007 B2 * | 12/2010 | Kaneko et al. | 264/177.12 |
| 7,871,715 B2 * | 1/2011 | Okada et al. | 428/698 |
| 7,897,247 B2 * | 3/2011 | Martensson et al. | 428/216 |
| 2002/0189318 A1 * | 12/2002 | Kashiwazaki et al. | 72/467 |
| 2003/0064126 A1 * | 4/2003 | Miyazaki et al. | 425/461 |
| 2004/0265541 A1 * | 12/2004 | Ruppi | C23C 16/36 428/141 |
| 2005/0031727 A1 | 2/2005 | Matsuoka et al. | |
| 2006/0088621 A1 | 4/2006 | Matsuoka et al. | 425/382 |
| 2007/0134517 A1 * | 6/2007 | Martensson et al. | 428/698 |
| 2007/0187651 A1 | 8/2007 | Naruse et al. | |
| 2009/0061156 A1 * | 3/2009 | Ulrich et al. | 428/141 |
| 2009/0186116 A1 | 7/2009 | Saito et al. | |
| 2010/0098911 A1 * | 4/2010 | Tanibuchi et al. | 428/141 |

FOREIGN PATENT DOCUMENTS

| | | | | |
|---|---|---|---|---|
| EP | 1649994 A2 * | 4/2006 | | B28B 3/20 |
| JP | 1991-281306 A | 12/1991 | | |
| JP | 1993-269719 A | 10/1993 | | |
| JP | 2008-132752 A | 6/2008 | | |
| WO | 9858367 A1 | 12/1998 | | |
| WO | 0136711 A1 | 5/2001 | | |
| WO | 2007074507 A1 | 7/2007 | | |

OTHER PUBLICATIONS

Alex Tabenkin, "To Each His Own Parameter Custom surface finish parameters can create more problems than they solve—unless you know what to watch out for," available at http://www.qualitydigest.com/june01/html/surface.html, Aug. 28, 2012, Copyright 2000 QCI International. All rights reserved.

B.C. MacDonald & Co. Broshurw, "Basic Components & Elements of Surface Topography," available online at http://www.bcmac.com/pdf_files/surface%20finish%20101.pdf, Aug. 28, 2012, date unknown.

Japanese Patent Office; Office Action; Dispatch Date: Jul. 2, 2013; pp. 1-5.

Rogl, "Materials science of ternary metal boron nitrides", International Journal of Inorganic Materials 3 (2001) p. 201-209.

\* cited by examiner

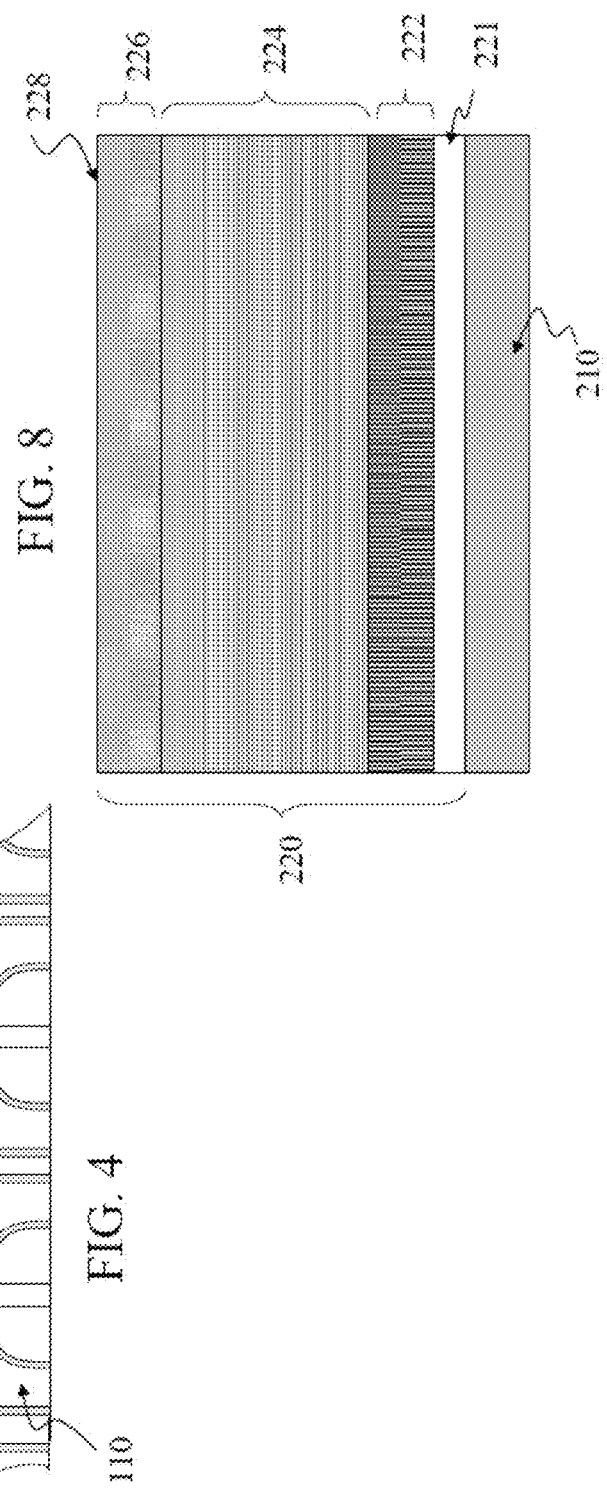

WEAR RESISTANT COATINGS FOR TOOL DIES

CROSS REFERENCE TO RELATED APPLICATIONS

This application claims the benefit of U.S. Provisional Application 61/092,424, filed Aug. 28, 2008, the contents of which are incorporated herein by reference in their entirety.

BACKGROUND

The disclosure relates to tool dies used for forming green ceramic bodies. More particularly, the disclosure relates to tool dies having a wear resistant coating. Even more particularly, the disclosure relates to tool dies having a wear resistant coating having multiple layers.

Ceramic products, such as honeycomb structures that are used as filters and catalyst supports, are typically manufactured by extrusion through at least one extrusion die to form green bodies that are then dried and fired to produce strong, refractory ceramic structures. Such dies are presently made from durable metals or alloys such as tool steels or stainless steels. Dies are subject to rapid wear from the ceramic batch materials that are extruded, and must be discarded when the amount of wear prevents extrusion of products that meet specifications.

A wear resistant coating is often applied to such dies to extend their service life. Such coatings are sometimes fabricated from refractory materials such as inorganic carbides, nitrides, and combinations thereof using chemical vapor deposition. Due to their hardness and surface roughness, however, such coatings require a long period of pre-conditioning or break-in before they are suitable for use in production. Such pre-conditioning is sometimes so long as to consume a significant portion of the useful life of the die.

SUMMARY

The present disclosure provides a tool die for forming a green ceramic body. The tool die has a wear resistant coating that is deposited on a substrate and has an outer or free surface having a morphology that provides a mean roughness in a range from about 0.03 μm up to about 0.8 μm Rq. In one embodiment, the wear resistant coating has multiple alternating layers of fine grained and coarse grained materials. Methods of making the tool die and wear resistant coating are also provided.

Accordingly, one aspect of the disclosure is to provide a tool die for making a green ceramic body. The tool die comprises a substrate and a wear resistant coating deposited on a surface of the substrate. The wear resistant coating has an outer surface having a morphology that has a mean roughness in a range from about 0.03 μm up to about 0.8 μm Rq.

A second aspect of the disclosure is to provide a wear resistant composite coating for a tool die for forming a green ceramic body. The wear resistant composite coating comprises: a base layer disposed on the surface of the substrate; a plurality of layers disposed over the base layer; and an outer layer of a fine grained material. The plurality of layers comprises a first layer of a fine grained material alternating with a second layer of a coarse grained material. The outer layer has an outer surface disposed over the plurality of layers. The outer surface has a morphology that has a mean roughness in a range from about 0.03 μm up to about 0.8 μm Rq.

A third aspect of the disclosure is to provide a method of making a tool die for forming a green ceramic body and having a wear resistant coating. The method comprises the steps of: providing a tool die; and depositing a wear resistant coating on a surface of the tool die. The wear resistant coating has an outer surface having a morphology that has a mean roughness of in a range from about 0.03 μm up to about 0.8 μm Rq.

A fourth aspect of the disclosure is to provide a method of depositing a wear resistant layer on a tool die. The method comprises the steps of: depositing a base layer on a surface of the tool die; depositing a plurality of layers over the base layer, the plurality of layers comprising a first layer of a fine grained material alternating with a second layer of a coarse grained material; and depositing an outer layer over the plurality of layers. The outer layer has an outer surface having a morphology that has a mean roughness in a range from about 0.03 μm up to about 0.8 μm Rq.

These and other aspects, advantages, and salient features of the present disclosure will become apparent from the following detailed description, the accompanying drawings, and the appended claims.

BRIEF DESCRIPTION OF THE DRAWINGS

FIG. 4 is a schematic cross-sectional view of a tool die;

FIG. 8 is schematic cross-sectional view of a wear resistant coating having multiple layers.

DETAILED DESCRIPTION

Figure 3:
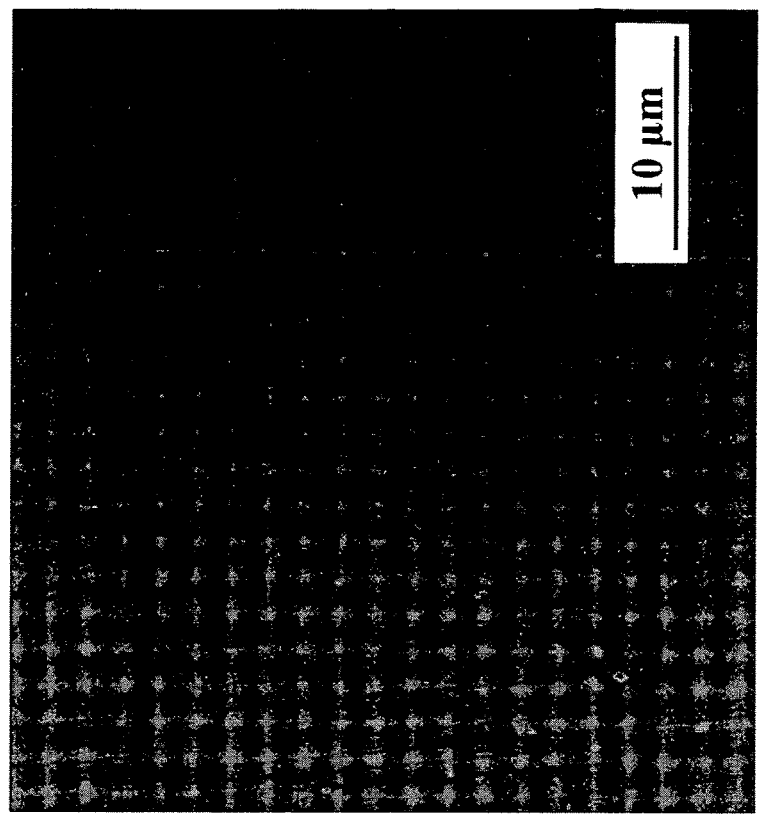
FIG. 3 is a SEM image of a $TiC_xN_{1-x}$ coated pin side surface of an extrusion die after an entire interval of steady state extrusion performance.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range, as well as any sub-ranges therebetween.

Figure 1:
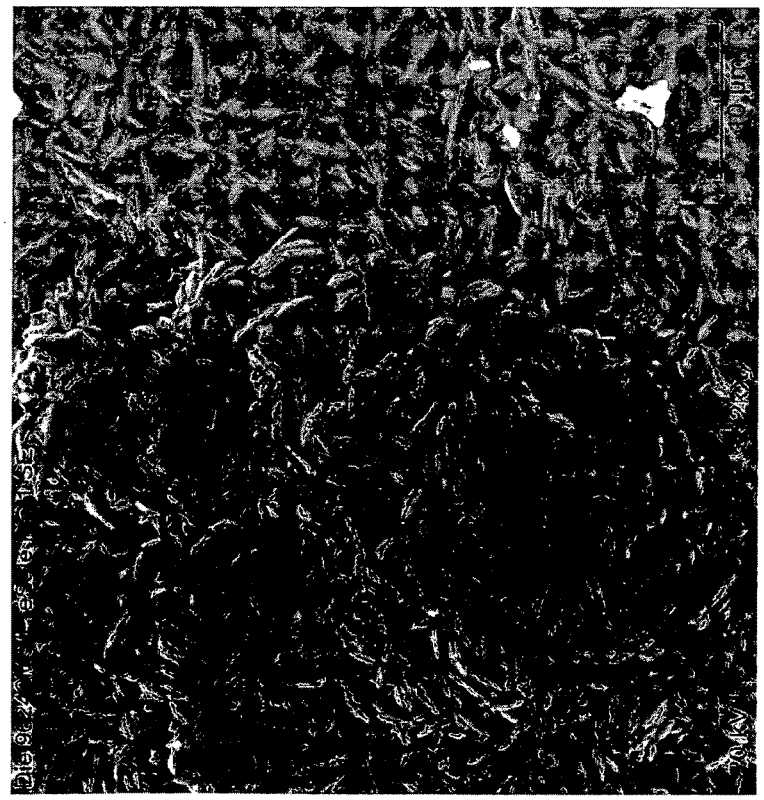
FIG. 1 is scanning electron microscopy (SEM) image of a top view of the pin side surface of an extrusion die having a $TiC_xN_{1-x}$ coating with a columnar grain structure.

Referring to the drawings in general and to FIG. 1 in particular, it will be understood that the illustrations are for the purpose of describing particular embodiments and are not intended to limit the disclosure or appended claims thereto. The drawings are not necessarily to scale, and certain features and certain views of the drawings may be shown exaggerated in scale or in schematic in the interest of clarity and conciseness.

Tool dies, particularly those used in extrusion processes, are subject to extensive wear. Such wear is exacerbated in those instances where the body of the tool die is a soft metal or alloy, such as a stainless steel, and the batch material being extruded comprises a hard ceramic material such as, for example, cordierite (magnesium iron aluminum silicate), aluminum titanate, or the like.

To extend the lifetime of such tool dies, wear resistant coatings are provided to the surface of such dies. Such coatings typically include inorganic carbides or nitrides, and are applied to the tool die by chemical vapor deposition (CVD). The conditions at which the CVD process is carried out dictate the surface morphology of the wear resistant coating. Titanium carbonitride ($TiC_xN_{1-x}$) coatings, for example, are grown at temperatures ranging from about 800° C. to 850° C. These coatings tend to grow in a columnar fashion, which produces a faceted morphology on the free or outer surface of the coating. A scanning electron microscopic (SEM) image (FIG. 1), obtained at 2000× magnification, of the surface of a $TiC_xN_{1-x}$ coating, deposited on a side surface of a slot-forming pin from the discharge face of an extrusion die, clearly shows the columnar structure of the individual grains. The length scale of the sharp fine features on the free surface of the coating are in the 1-3 range.

Figure 2:
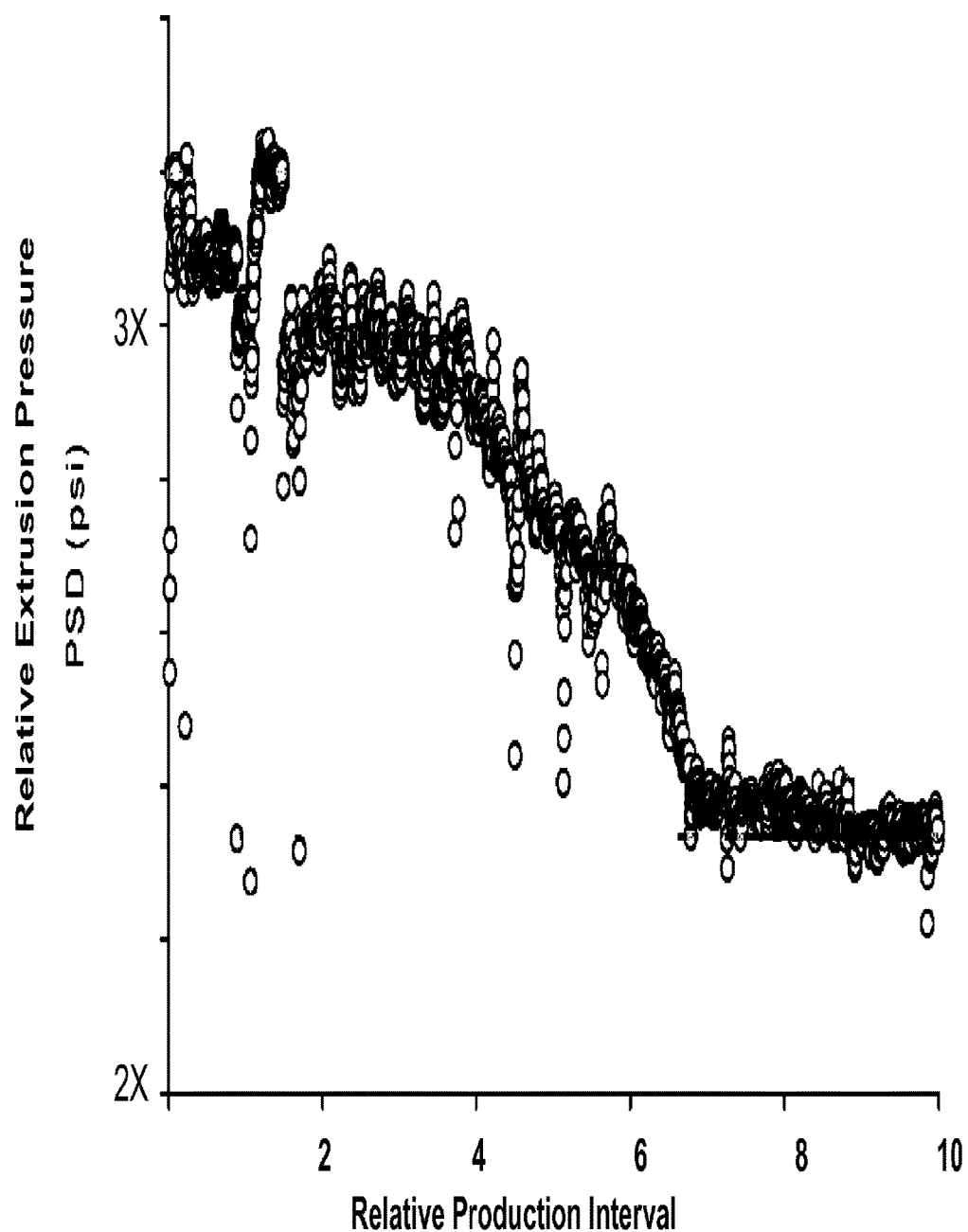
FIG. 2 is a plot of extrusion pressure through a $TiC_xN_{1-x}$-coated honeycomb extrusion die as a function of time in production.

The high extrusion pressures exhibited by a die in the early stages of use suggest that a high degree of surface roughness is initially present in the $TiC_xN_{1-x}$ coating. Extrusion pressure through a $TiC_xN_{1-x}$ coated honeycomb extrusion die is plotted as a function of time in production (represented as relative production intervals) in FIG. 2. Extrusion pressure is taken as a direct indicator of the surface finish of the $TiC_xN_{1-x}$ coating. Due to the high hardness of the $TiC_xN_{1-x}$ coating, a prolonged period of use or "break-in" is required before steady state extrusion performance at a reasonably low extrusion pressure is achieved. FIG. 1 is an image of a pin side surface prior to the start of production use of the die, corresponding to a production interval of zero in FIG. 2. FIG. 3 is a SEM micrograph of a similar pin side surface at a relative production interval of 10 on the horizontal scale shown in FIG. 2, and is considered representative of pin surface finish over the entire interval of steady state extrusion performance illustrated in FIG. 2. Whereas the initial coating shown in FIG. 1 exhibits a faceted $TiC_xN_{1-x}$ crystal morphology on a scale sufficiently large to present a significant impediment to the smooth flow of plasticized powder batch materials over the surfaces of the coated pins, the pin surface finish shown in FIG. 3 is characterized by the nearly complete absence of visible crystalline protrusions, crystal facets, or crystal grain boundaries.

The ceramic batch that comes in contact with such coatings contains constituents that are much finer in scale than the grains shown in FIG. 1. During extrusion, the batch material interlocks with the surface features of the coating. This phenomenon increases the friction and wall drag and hence the overall pressure of the die. In particular, the interaction between the coating morphology and batch material leads to the evolution of die pressure during extrusion. The pressure curve evolution leads to poor stability of the extrusion hardware setup. Consequently, extruded products are ridden with green defects in either the skin, matrix, or bulk of the product.

Described herein is a wear resistant coating and a tool die having such a coating. The wear resistant coating described herein is grown such that the resulting free or outer surface of the coating is smooth. In one embodiment, the growth mechanism for the coating is modified by the addition of at least one dopant to the coating. The modification of the growth mechanism leads to a migration from the columnar coarse grained structure normally observed for coating materials to an equiaxial fine grained structure that lends itself to a smooth surface.

Figure 10:
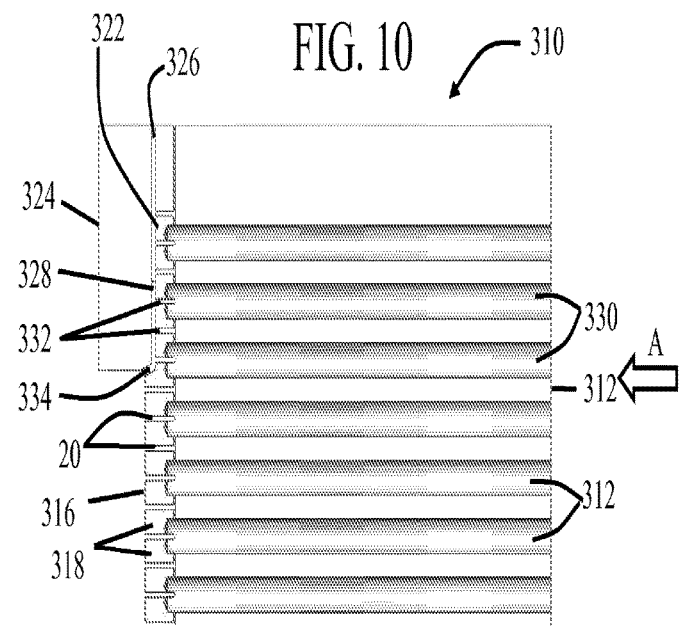
FIG. 10 is a schematic cross-sectional view of a tool die.

A tool die for forming a green ceramic structure is provided. A cross-sectional view of a tool die in which a portion of the outlet pin face is cut away is schematically shown in FIG. 10. The tool die 310 has an inlet or feedhole face 312 open to a plurality of feedholes 314 and an outlet or pin face 316 having a plurality of pins 318 surrounded by discharge slots 320. A portion of the outlet face 316, adjacent an outer skin-forming region, is cut away at 322. A mask or skin-forming ring 324, spaced from the die 310 by a shim 326, overlies the cut away portion 322. The ring or mask 324 forms a reservoir 328 in the cut away portion 322, between the mask and the die, which is fed with batch material from feed holes 330 and reduced slots 332, when plasticized batch material (not shown) is caused to flow in the direction of arrow A. The material collected in reservoir 328 flows out through a skin-forming gap 334 as a skin layer on a honeycomb core concurrently formed from plasticized batch material that is discharged from slots 320 not covered by skin-forming ring 324.

A cross-sectional view of a portion of tool die 210 shown in FIG. 10 is schematically shown in FIG. 4. Tool die portion 100 shown in FIG. 4 is a pin used in the extrusion of a ceramic precursor material, and comprises a substrate 110 and a wear resistant coating 120 deposited on a surface 112 of substrate 110. Wear resistant coating 120 has an outer surface 128 that has a morphology having a mean roughness in a range from about 0.03 μm up to about 0.8 μm Rq as determined by interferometric techniques that are known in the art. The mean roughness Rq correlates highly with the impedance of the die.

In one embodiment, tool die 100 is an extrusion die such as, but not limited to, a honeycomb extrusion die. Such extrusion dies typically include slot and pin structures. Alternatively, tool die 200 may be other extrusion elements or tooling—such as screws, plungers, or the like—where low surface roughness is desirable.

Substrate 110 may be any material known in the art that is used to make tool dies. These may, for example, include metals, alloys, composite materials, or the like. In one embodiment, substrate 100 is tool steel or a stainless steel such as, but not limited to, 422 and 450 stainless steels. Additional coatings of metals or alloys, such as nickel, nickel based alloys, or the like, may be applied to the surface of the substrate.

Wear resistant coating 120 has a thickness t of at least 20 μm and, in one embodiment, at least 50 μm. In one embodiment, wear resistant coating 120 has a thickness of up to about 65 μm. Wear resistant coating 120 comprises at least one of an inorganic carbide, an inorganic nitride, or combinations thereof. Such combinations include, but are not limited to, single phase materials, such as carbonitrides, and multiphase combinations of carbides and nitrides. Non-limiting examples of such carbides and nitrides include titanium carbides (TiC), tungsten carbides ($W_3C$, WC, $W_2C$), molybdenum carbides ($Mo_xC_y$), titanium nitrides (TiN), and titanium carbonitrides ($TiC_xN_{1-x}$, where $0.35 \leq x \leq 0.65$). Such materials may have either stoichiometric or non-stoichiometric (e.g., substoichiometric) compositions.

Figure 5:
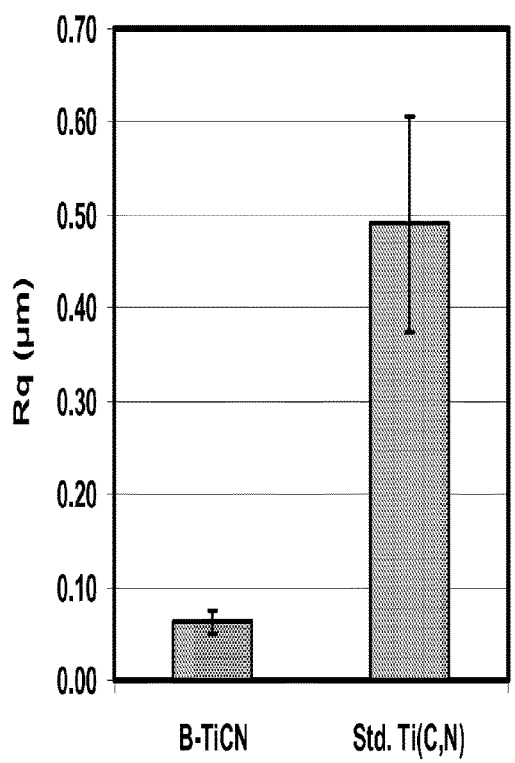
FIG. 5 is a plot of surface roughness Rq for free surfaces of $TiC_xN_{1-x}$ coatings that are undoped and doped with boron.
Figure 6:
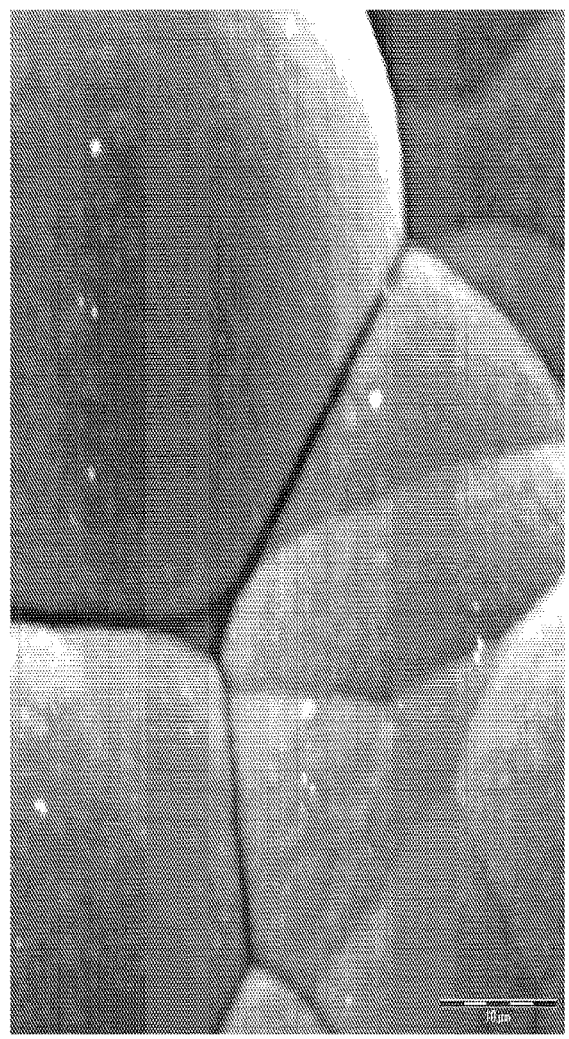
FIG. 6 is a SEM image of the free surface of a boron-doped $TiC_xN_{1-x}$ coating.

The columnar growth shown in FIG. 1 is a direct result of the competitive nature of the nucleation and growth of the materials that form wear resistant coating 120, given the high deposition rate conditions that drive most CVD processes. To achieve a smooth, fine-grained surface in such CVD processes, the mechanism that favors columnar or faceted growth of grains on the free surface of the substrate must therefore be altered. In one embodiment, the growth mechanism may be altered by introducing a dopant having a very high surface diffusivity, which upsets the ordinary growth mechanism of wear resistant coating 120. Accordingly, wear resistant coating 120 may further comprise at least one dopant. In one embodiment, the dopant has a high diffusivity on outer surface 128 during formation of wear resistant coating 120. Such dopants include, but are not limited to, boron, carbon monoxide, aluminum, sulfur, and the like. Preliminary results indicate the surface roughness of a $TiC_xN_{1-x}$ coating can be reduced by a factor of 2 and, in some embodiments, by a factor of 10, by introducing boron as a dopant. Data plotted in FIG. 5 show a threefold reduction in mean roughness Rq of the free surface of $TiC_xN_{1-x}$ coatings when boron is used as a dopant. An SEM image (2000× magnification) of the free surface of a boron-doped $TiC_xN_{1-x}$ coating is shown in FIG. 6. Compared to the surface of undoped $TiC_xN_{1-x}$ shown in FIG. 1, the surface roughness of the coating in FIG. 6 is markedly decreased.

Figure 7:
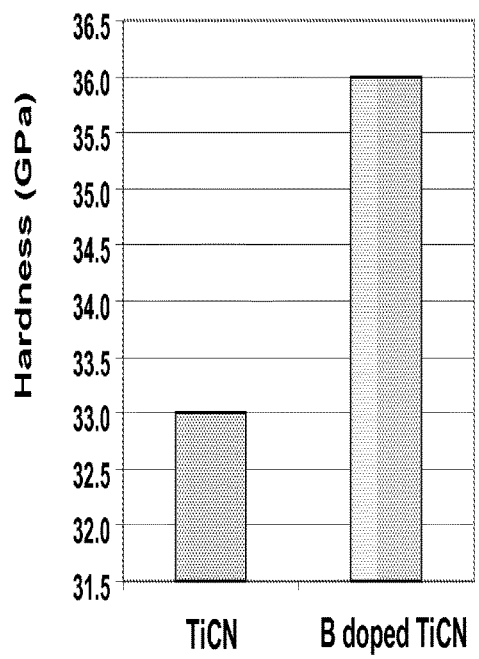
FIG. 7 is a plot of hardness for free surfaces of $TiC_xN_{1-x}$ coatings that are undoped and doped with boron.

As used herein, the term "morphology" refers in general to the shape and size of the individual crystalline grains that comprise wear resistant coating 120. It will be appreciated by those skilled in the art that different types of crystal shapes and habits may be achieved for a given material, and that such shapes may be determined by the composition of the material and the conditions under which the material (and resulting coating) are formed on substrate 110. The morphology of outer surface 128 is selected to provide outer surface 128 with the desired level of roughness; i.e., conditions for depositing wear resistant coating 120 are selected so as to provide outer surface 128 with the desired morphology. In one embodiment, the morphology of outer surface is an equiaxial morphology having an average grain size less than or equal to about 0.05 μm (also referred to as a "fine grained" morphology or structure). Moreover, the hardness of wear resistant coating 120 is increased due to the fine grained morphology, as plotted in FIG. 7.

Figure 9:
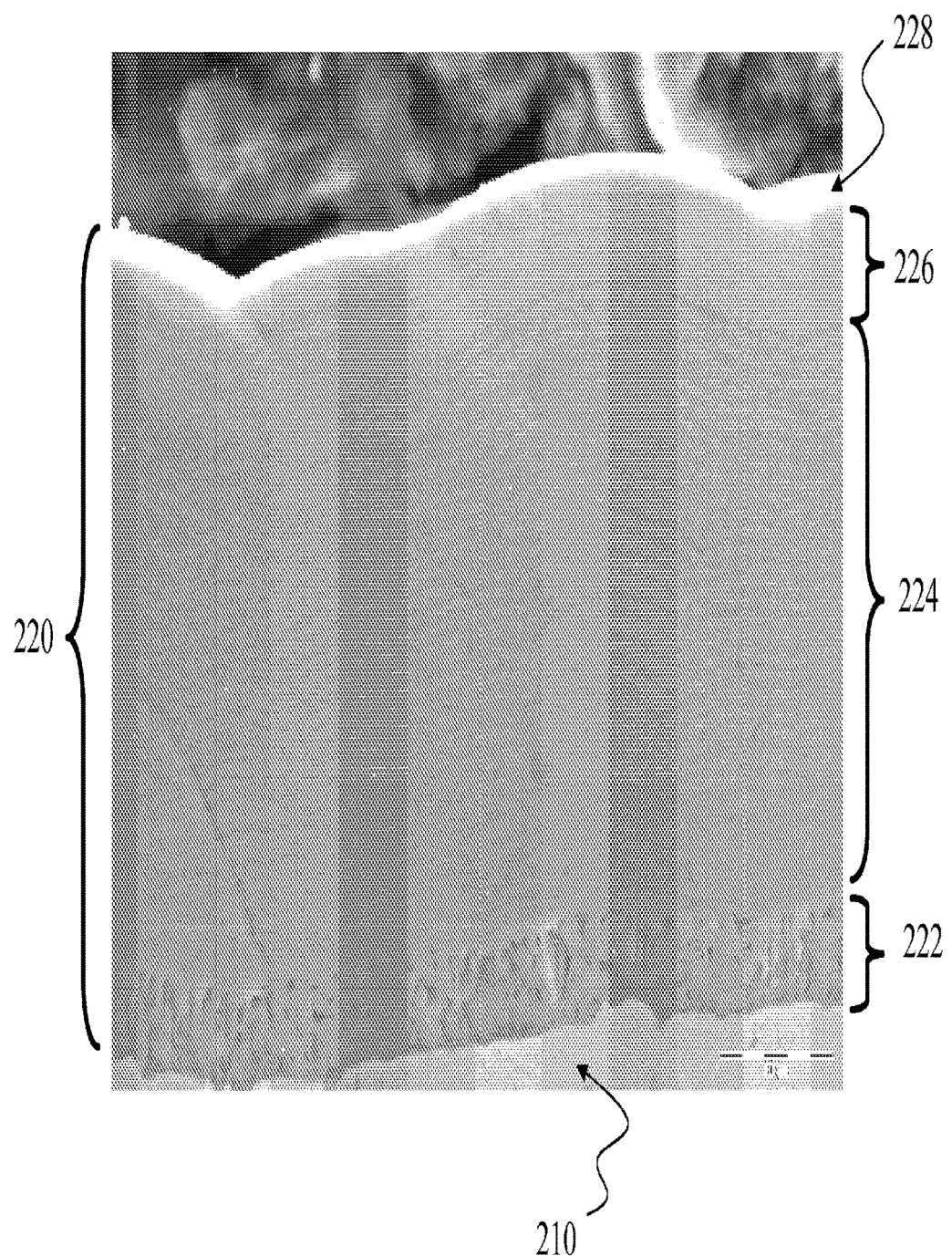
FIG. 9 is a SEM image of a cross section of a wear resistant coating having multiple layers.

Stress levels in wear resistant coating 120 can promote spontaneous spallation. Although the extent of stress arising from thermal mismatch strain cannot be completely eliminated, it can be reduced by controlling the morphology of wear resistant coating 120. One of way of reducing such stress is using a porous microstructure to build strain tolerance into the coating. The thickness of the constituent layers is a process parameter that can be used to control the coating's surface morphology (or) roughness. Accordingly, one embodiment of wear resistant coating 120 comprises multiple layers of material that include layers having inherent porosity to tolerate strain. CVD deposited $TiC_xN_{1-x}$ layers, for example, have up to about 20% inherent porosity. A schematic cross-sectional view of one such embodiment is shown in FIG. 8, and a scanning electron microscopy (SEM) image of a cross section of the same embodiment is shown in FIG. 9. Wear resistant coating 220 comprises a base layer 222 disposed on surface 212 of substrate 210. A plurality of layers 224 disposed over base layer 222, and an outer layer 226 disposed over plurality of layers 224 and having an outer surface 228.

Base layer 222 comprises a coarse grained (i.e., having an average grain size of at least about 1 μm) or columnar grain structure and has a thickness ranging from about 1 μm up to about 5 μm. In one embodiment, base layer 222 has a thickness of about 9 μm. Plurality of layers 224 comprises a first layer of fine grained material alternating with a second layer of coarse grained material. Each of the first layer and second layer has a thickness in a range from about 0.5 μm up to about 3 μm. In one embodiment, each of the first layer and the second layer has a thickness of up to about 1 μm. Outer layer 226 comprises a material having a morphology that provides outer surface 228 with a mean roughness in a range from about 0.03 μm up to about 0.8 μm Rq and has a thickness in a range from about 3 μm up to about 15 μm. In one embodiment, outer layer 226 has a thickness of about 10 μm.

In the wear resistant coating 220 shown in FIG. 9, base layer 222 comprises titanium carbide. Plurality of layers 224 comprises alternating first, fine-grained, layers of boron-doped titanium carbonitride and second, coarse-grained, layers of titanium carbide. Outer layer 226 comprises fine grained, boron-doped titanium carbonitride.

In addition to base layer 222, plurality of layers 224, and outer layer 226, wear resistant coating 220 includes additional layers of material disposed between base layer 222 and plurality of layers 224. For example, a layer of TiN or elemental titanium (221 in FIG. 8), having a thickness of up to about 1 μm, is disposed between substrate 210 and base layer 222 to smooth out any inherent roughness of substrate 210 and ensure growth and of titanium carbonitride so as to provide substantially complete coverage of underlying base layer 222 and substrate 210.

A method of making the tool die having a wear resistant coating described herein is also provided. A tool die is first provided. The tool die may be any material known in the art that is used to make tool dies. These may, for example, include metals, alloys, composite materials, or the like. In one embodiment, the tool die is a stainless steel such as, but not limited to, 422 and 450 stainless steels. The tool die is machined and finished to its final shape using those methods known in the art such as, but not limited to, electron discharge machining and the like.

The wear resistant coating is deposited on a surface of the tool die using those methods known in the art and previously described herein. The wear resistant coating has an outer surface having a morphology that provides a mean surface roughness in a range from about 0.03 μm up to about 0.8 μm Rq. The wear resistant coating comprises at least one of an inorganic carbide, an inorganic nitride, and combinations thereof, and may further include at least one dopant.

In one embodiment, the wear resistant coating comprises a base layer, a plurality of layers comprising alternating first and second layers, and an outer layer. In one embodiment, the wear resistant coating is formed using chemical vapor deposition (CVD) methods that are known in the art. However, other means, such as physical vapor deposition methods known in the art, may be used to form wear resistant coating 120. In addition, such methods may be combined with CVD to form wear resistant coating 120. Plasma assisted or enhanced chemical vapor deposition is a non-limiting example of such combined physical and chemical vapor deposition techniques.

It will be appreciated by those skilled in the art the actual conditions used (i.e., temperature, retort pressure, precursors, and flow rates of gaseous species) to deposit the wear resistant coating depend at least in part on the desired composition of the coating. For example, chemical vapor deposition of $TiC_xN_{1-x}$ coatings is typically carried out at temperatures ranging from about 800° C. up to about 850° C. using precursors such as titanium tetrachloride (or other titanium halides), hydrogen, and methyl cyanide ($CH_3CN$). Tungsten carbide coatings may be deposited at temperatures ranging from 300° C. up to 500° C. using combinations of $WF_6$, $C_6H_6$ and $H_2$. Molybdenum carbide coatings may be deposited in an atmosphere comprising, for example, molybdenum hexafluoride, hydrogen, and at least one of benzene, xylene, butane, propane, or the like.

The following examples, while in no way intended to limit the invention thereto, describe the deposition of wear resistant coatings comprising a titanium nitride (TiN) base layer and a titanium carbonitride ($TiC_xN_{1-x}$) outer layer using various dopants on 422 stainless steel honeycomb dies. As described herein, the term "dopants" includes gaseous as well as condensed phase species that are intended to alter the morphology or growth kinetics of the wear resistant coating.

Example 1. Coating with Nitrogen

In Example 1, the impact of nitrogen ($N_2$) flow rates, in conjunction with low partial pressures of reactants, on the chemical vapor deposition of TiN and $TiC_xN_{1-x}$ coatings was studied. The addition of nitrogen ($N_2$) to the CVD system improved the uniformity of the resulting coating, but no significant change in the morphology was observed. CVD process parameters used for coating a substrate using nitrogen ($N_2$) are listed in Table 1.

TABLE 1

|  | TiN | $TiC_xN_{1-x}$ |
| --- | --- | --- |
| Temperature (° C.) | 805-820 | 805 |
| Coating time (hr) | 0.75 | 10.00 |
| Retort pressure (mbar) | 160 | 95 |
| Mass flow rates (slm) |  |  |
| $TiCl_4$ | 0.00125 | 0.00250 |
| $CH_3CN$ | — | $3.30 \times 10^{-4}$ |
| $N_2$ | 10.00 | 17.00 |
| $H_2$ | 20.00 | 5.00 |

Example 2. Coating with $H_2S$

The impact of $H_2S$ as a growth inhibitor was studied in Example 2. CVD process parameters used for coating a substrate using $H_2S$ are listed in Table 2. The addition of $H_2S$ provided a smooth outer coating. However, the high growth rate resulting from $H_2S$ addition caused blockage of the honeycomb dye.

TABLE 2

|  | TiN | $TiC_xN_{1-x}$ |
| --- | --- | --- |
| Temperature (° C.) | 805-820 | 805 |
| Coating time (hr) | 0.75 | 10.00 |
| Retort pressure (mbar) | 160 | 95 |
| Mass flow rates (slm) |  |  |
| $TiCl_4$ | 0.00125 | 0.00250 |
| $CH_3CN$ | — | $3.30 \times 10^{-4}$ |
| $N_2$ | 10.00 | — |
| $H_2$ | 20.00 | 22.00 |
| $H_2S$ | — | 0.06 |

Example 3. Coating with He

The impact of helium, an inert gas, as a growth inhibitor was studied in Example 3. Helium has good thermal conductivity and a viscosity that is close to $H_2$, giving it excellent penetration properties and high diffusivity. CVD process parameters used for coating a substrate using helium are listed in Table 3.

TABLE 3

|  | TiN | $TiC_xN_{1-x}$ |
| --- | --- | --- |
| Temperature (° C.) | 805-820 | 805 |
| Coating time (hr) | 0.75 | 10.00 |
| Retort pressure (mbar) | 160 | 95 |
| Mass flow rates (slm) |  |  |
| $TiCl_4$ | 0.00125 | 0.00250 |
| $CH_3CN$ | — | $3.30 \times 10^{-4}$ |
| $N_2$ | 10.00 | — |
| $H_2$ | 20.00 | 5.00 |
| He | — | 17.00 |

Example 4. Coating with Propane

The impact of propane as a growth inhibitor was studied in Example 4. CVD process parameters used for coating a substrate using propane are listed in Table 4.

TABLE 4

|  | TiN | $TiC_xN_{1-x}$ |
| --- | --- | --- |
| Temperature (° C.) | 805-820 | 805 |
| Coating time (hr) | 0.75 | 3.00 |
| Retort pressure (mbar) | 160 | 100 |
| Mass flow rates (slm) |  |  |
| $TiCl_4$ | 0.00140 | 0.0030 |
| $CH_3CN$ | — | — |
| $N_2$ | 10.00 | — |
| $H_2$ | 20.00 | 5.00 |
| $C_3H_8$ | — | 0.6 |

Example 5. Coating with Carbon Monoxide

The impact of carbon monoxide as a growth inhibitor was studied in Example 5. The die was coated with $TiC_xN_{1-x}$ without CO addition for 100 minutes, followed by coating with CO addition for 500 minutes. Being a strong oxidizer, carbon monoxide reacts with $TiC_xN_{1-x}$ to from titanium carboxynitride, the presence of which can have an effect on coating structure and morphology. CVD process parameters used for coating a substrate using carbon monoxide are listed in Table 5.

TABLE 5

|  | TiN | TiC$_x$N$_{1-x}$ |
|---|---|---|
| Temperature (° C.) | 805-820 | 805 |
| Coating time (hr) | 0.75 | 10.00 |
| Retort pressure (mbar) | 160 | 95 |
| Mass flow rates (slm) |  |  |
| TiCl$_4$ | 0.00125 | 0.00250 |
| CH$_3$CN | — | 3.30 × 10$^{-4}$ |
| N$_2$ | 10.00 | — |
| H$_2$ | 20.00 | 22.00 |
| CO | — | 0.6 |

Example 6. Coating with Aluminum Chloride

The impact of aluminum chloride (AlCl$_3$) as a growth inhibitor was studied in Example 6. The die was coated with TiC$_x$N$_{1-x}$ without AlCl$_3$ addition for one hour, followed by coating with AlCl$_3$ addition for nine hours. The results showed that, while AlCl$_3$ acts as an inhibitor, the deposition rate increased. CVD process parameters used for coating a substrate using AlCl$_3$ are listed in Table 6.

TABLE 6

|  | TiN | TiC$_x$N$_{1-x}$ |
|---|---|---|
| Temperature (° C.) | 805-820 | 805 |
| Coating time (hr) | 0.75 | 10.00 |
| Retort pressure (mbar) | 160 | 95 |
| Mass flow rates (slm) |  |  |
| TiCl$_4$ | 0.00125 | 0.0030 |
| CH$_3$CN | — | 3.30 × 10$^{-4}$ |
| N$_2$ | 10.00 | — |
| H$_2$ | 20.00 | 18.70 |
| AlCl$_3$ | — | 0.1 |
| Carrier gas | — | 3.00 |

Example 7. Coating with Metallic Titanium as Precursor

The impact of coating the die using metallic titanium as a precursor was studied in Example 7. The presence of metallic titanium increases the number of titanium cations without increasing the number of chlorine anions, which usually reduce wear. CVD process parameters used for coating a substrate using titanium are listed in Table 7.

TABLE 7

|  | TiN | TiC$_x$N$_{1-x}$ |
|---|---|---|
| Temperature (° C.) | 805-820 | 805 |
| Coating time (hr) | 0.75 | 10.00 |
| Retort pressure (mbar) | 160 | 95 |
| Mass flow rates (slm) |  |  |
| TiCl$_4$ | 0.00125 | 0.00250 |
| CH$_3$CN | — | 3.30 × 10$^{-4}$ |
| N$_2$ | 10.00 | — |
| H$_2$ | 20.00 | 22.00 |

Example 8. Coating with Boron Doped TiC$_x$N$_{1-x}$

The impact of boron as a growth inhibitor was studied in Example 8. The die was coated with TiC$_x$N$_{1-x}$ without boron addition for three hours, followed by coating with boron addition for seven hours. The results showed that boron acts as a grain refining agent and can smooth the morphology of TiC$_x$N$_{1-x}$ grain faces. CVD process parameters used for coating a substrate using boron as a growth inhibitor are listed in Table 8.

TABLE 8

|  | TiN | TiC$_x$N$_{1-x}$ |
|---|---|---|
| Temperature (° C.) | 805-820 | 805 |
| Coating time (hr) | 0.75 | 10.00 |
| Retort pressure (mbar) | 160 | 95 |
| Mass flow rates (slm) |  |  |
| TiCl$_4$ | 0.00125 | 0.00250 |
| CH$_3$CN | — | 3.30 × 10$^{-4}$ |
| N$_2$ | 10.00 | — |
| H$_2$ | 20.00 | 22.00 |
| BCl$_3$ | — | 0.1 |

While typical embodiments have been set forth for the purpose of illustration, the foregoing description should not be deemed to be a limitation on the scope of the disclosure or appended claims. Accordingly, various modifications, adaptations, and alternatives may occur to one skilled in the art without departing from the spirit and scope of the present disclosure and claims.

The invention claimed is:

1. An extrusion element for forming a green ceramic body, the extrusion element comprising:
   a. a substrate; and
   b. a boron doped wear resistant coating comprising:
      a base layer deposited on a surface of the substrate;
      a plurality of layers disposed over the base layer, the plurality of layers comprising a first layer of fine grained material having an average grain size less than 0.05 μm alternating with a second layer of coarse grained material having an average grain size of at least 1 μm; and
      an outer layer of a fine grained material disposed over the plurality of layers, the outer layer comprising at least one of an inorganic carbide, an inorganic nitride, and combinations thereof, having an average grain size less than 0.05 μm, and having an outer surface, wherein the outer surface has a fine grained equiaxial morphology that has a Rq roughness in a range from 0.03 μm up to 0.8 μm, and
   wherein the wear resistant coating has a thickness of at least 50 μm.

2. The extrusion element of claim 1, wherein the substrate is stainless steel.

3. The extrusion element of claim 1, wherein the extrusion element is one of a honeycomb extrusion die, a die screw, or a plunger.

4. The extrusion element of claim 1, wherein the boron doped wear resistant coating comprises at least one of an inorganic carbide, an inorganic nitride, and combinations thereof.

5. The extrusion element of claim 4, wherein the boron doped wear resistant coating comprises at least one of titanium nitride, titanium carbide, titanium carbonitride, tungsten carbide, molybdenum carbide, and combinations thereof.

6. The extrusion element of claim 4, wherein the boron doped wear resistant coating further comprises at least one dopant selected from the group consisting of sulfur and aluminum.

7. The extrusion element of claim 1, wherein the boron doped wear resistant coating has a thickness of up to 65 μm.

8. The extrusion element of claim 1, wherein the boron doped wear resistant coating is boron doped $TiC_xN_{1-x}$.

9. An extrusion element for forming a green ceramic body, the extrusion element comprising:
 a. a substrate; and
 b. a wear resistant coating on a surface of the substrate, the wear resistant coating comprising:
 c. a base layer disposed on the surface of the substrate;
 d. a plurality of layers disposed over the base layer, the plurality of layers comprising a first layer of a fine grained material having an average grain size less than 0.05 μm and a second layer of a coarse grained material having an average grain size of at least 1 μm; and
 e. an outer layer of a fine grained material disposed over the plurality of layers, the outer layer comprising at least one of an inorganic carbide, an inorganic nitride, and combinations thereof, having an average grain size less than 0.05 μm, and having an outer surface, wherein the outer surface has an equiaxial morphology that has a Rq roughness in a range from 0.03 μm to 0.8 μm.

10. The extrusion element of claim 9, wherein the base layer comprises at least one of (a) coarse grained material having an average grain size of at least 1 μm and (b) columnar grain structure, and
the base layer has a thickness of at least 9 μm.

11. The extrusion element of claim 9, wherein
the first layer has a thickness in a range from 0.5 μm to 3 μm,
the second layer has a thickness in a range from 0.5 μm to 3 μm, and
the outer layer has a thickness in a range from 3 μm to 15 μm.

12. The extrusion element of claim 9, wherein
the base layer comprises titanium carbide,
the first layer comprises boron doped titanium carbonitride,
the second layer comprises titanium carbide, and
the outer layer comprises boron doped titanium carbonitride.

13. An extrusion element for forming a green ceramic body, the extrusion element comprising:
 a. a substrate; and
 b. a wear resistant coating comprising:
 a base layer disposed on a surface of the substrate;
 a plurality of layers disposed over the base layer, the plurality of layers comprising a first layer of fine grained material having an average grain size less than 0.05 μm and a second layer of a coarse grained material having an average grain size of at least 1 μm; and
 an outer layer of a fine grained material disposed over the plurality of layers, the outer layer comprising at least one of an inorganic carbide, an inorganic nitride, and combinations thereof, having an average grain size less than 0.05 μm, and having an outer surface wherein the outer surface has a fine grained equiaxial morphology that has a Rq roughness in a range from 0.03 μm up to 0.8 μm, and
 wherein the wear resistant coating has a thickness of at least 50 μm.

14. The extrusion element of claim 13, wherein the wear resistant coating is boron doped $TiC_xN_{1-x}$.

15. The extrusion element of claim 13, wherein the substrate is stainless steel.

16. The extrusion element of claim 13, wherein the wear resistant coating comprises at least one of an inorganic carbide, an inorganic nitride, and combinations thereof.

17. The extrusion element of claim 16, wherein the wear resistant coating comprises at least one of titanium nitride, titanium carbide, titanium carbonitride, tungsten carbide, molybdenum carbide, and combinations thereof.

18. The extrusion element of claim 16, wherein the wear resistant coating further comprises a dopant selected from the group consisting of boron, sulfur, aluminum, or combinations thereof.

\* \* \* \* \*

UNITED STATES PATENT AND TRADEMARK OFFICE
CERTIFICATE OF CORRECTION

PATENT NO. : 9,796,108 B2  
APPLICATION NO. : 12/996849  
DATED : October 24, 2017  
INVENTOR(S) : Krishnakumar Vaidyanathan et al.

It is certified that error appears in the above-identified patent and that said Letters Patent is hereby corrected as shown below:

On the Title Page

In Column 1, item (75), Inventor, Line 1, delete "Krishna Kumar Vaidyanathan, Painted Post, NY (US)" and insert -- Krishnakumar Vaidyanathan, Naperville, IL (US) --, therefor.

Signed and Sealed this  
Twenty-first Day of April, 2020

Andrei Iancu  
*Director of the United States Patent and Trademark Office*